United States Patent
Weimar (10) Patent No.: US 8,648,368 B2
(45) Date of Patent: Feb. 11, 2014

(54) OPTOELECTRONIC COMPONENT WITH A PROTECTED PASSIVATION LAYER

(75) Inventor: Andreas Weimar, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 232 days.

(21) Appl. No.: 13/002,348

(22) PCT Filed: Aug. 6, 2009

(86) PCT No.: PCT/DE2009/001115
§ 371 (c)(1),
(2), (4) Date: Mar. 14, 2011

(87) PCT Pub. No.: WO2010/017807
PCT Pub. Date: Feb. 18, 2010

(65) Prior Publication Data
US 2011/0156076 A1  Jun. 30, 2011

(30) Foreign Application Priority Data
Aug. 12, 2008 (DE) .......................... 10 2008 038 750

(51) Int. Cl.
*H01L 33/00* (2010.01)
(52) U.S. Cl.
USPC ...................... 257/98; 257/626; 257/E33.068
(58) Field of Classification Search
USPC .................................... 257/98, 626, E33.068
See application file for complete search history.

(56) References Cited

U.S. PATENT DOCUMENTS

| | | | |
|---|---|---|---|
| 6,111,272 A | 8/2000 | Heinen | |
| 6,455,878 B1 | 9/2002 | Bhat et al. | |
| 7,109,527 B2 * | 9/2006 | Illek et al. | 257/95 |
| 7,592,194 B2 | 9/2009 | Jonda et al. | |
| 2004/0259278 A1 | 12/2004 | Illek et al. | |
| 2007/0001181 A1 * | 1/2007 | Chen | 257/98 |
| 2008/0001245 A1 * | 1/2008 | Yoneda et al. | 257/458 |

FOREIGN PATENT DOCUMENTS

| | | |
|---|---|---|
| EP | 0 905 797 | 3/1999 |
| EP | 1 592 070 | 11/2005 |
| JP | 2004-506331 | 2/2004 |
| JP | 2006-287223 | 10/2006 |
| WO | 01/82384 | 11/2001 |
| WO | 02/13281 | 2/2002 |
| WO | 03/038913 | 5/2003 |
| WO | 03/065464 | 8/2003 |

OTHER PUBLICATIONS

Schnitzer, I. et al, "30% external quantum efficiency from surface textured, thin-film light-emitting diodes" *Appl. Phys. Lett.*, vol. 63; Oct. 18, 1993, pp. 2174-2176.

* cited by examiner

*Primary Examiner* — Howard Weiss
(74) *Attorney, Agent, or Firm* — DLA Piper LLP (US)

(57) ABSTRACT

An optoelectronic component, includes a carrier, a metallic mirror layer arranged on the carrier, a first passivation layer arranged on a region of the metallic mirror layer, a semiconductor layer that generates an active region during electrical operation arranged on the first passivation layer, a second passivation layer including two regions, wherein the first region is arranged on a top face of the semiconductor layer, and the second region which is free of the semiconductor layer is arranged on the metallic mirror layer, and wherein the first and second regions are separated from one another by a region which surrounds the first passivation layer and which is free of the second passivation layer.

12 Claims, 6 Drawing Sheets

OPTOELECTRONIC COMPONENT WITH A PROTECTED PASSIVATION LAYER

RELATED APPLICATIONS

This is a §371 of International Application No. PCT/DE2009/001115, with an international filing date of Aug. 6, 2009 (WO 2010/017807 A2, published Feb. 18, 2010), which is based on German Patent Application No. 10 2008 038 750.9, filed Aug. 12, 2008, the subject matter of which is incorporated by reference.

TECHNICAL FIELD

This disclosure relates to optoelectronic components and methods of producing such components.

BACKGROUND

A widespread problem for optoelectronic components having a passivation layer is that instances of damage such as for example cracks which form in a part of the passivation layer can continue over the entire passivation layer. Thus, cracks can be formed, for example, if many optoelectronic components which are arranged on a common substrate and separated from one another by separating trenches in the substrate are singulated by for example sawing. These cracks in the separating trench can continue as far as the semiconductor layer and lead, inter alia, to accelerated aging on account of the ingress of moisture. Moisture can pass through the cracks into the semiconductor layer and cause there a short circuit of the component.

It could therefore be helpful to provide an optoelectronic component whose passivation layer has improved protection in the region of the semiconductor layer.

SUMMARY

I provide an optoelectronic component, including a carrier, a metallic mirror layer arranged on the carrier, a first passivation layer arranged on a region of the metallic mirror layer, a semiconductor layer that generates an active region during electrical operation arranged on the first passivation layer, a second passivation layer comprising two regions, wherein the first region is arranged on a top face of the semiconductor layer, and the second region which is free of the semiconductor layer is arranged on the metallic mirror layer; and wherein the first and second regions are separated from one another by a region which surrounds the first passivation layer and which is free of the second passivation layer.

I also provide a thin-film LED chip including the optoelectronic component.

I further provide a method for producing an optoelectronic component including A) providing a layer arrangement including a carrier, a metallic mirror layer, a first passivation layer and a semiconductor layer, B) removing a part of the first passivation layer, C) applying a second passivation layer on a top face of the semiconductor layer and on the metallic mirror layer, wherein a first region of the second passivation layer is produced on the top face of the semiconductor layer and a second region of the second passivation layer is produced on the mirror layer, and a region is formed which surrounds the first passivation layer and which is free of the second passivation layer separating the first region and the second region from one another.

DETAILED DESCRIPTION

One example relates to an optoelectronic component comprising a carrier, a metallic mirror layer arranged on the carrier, a first passivation layer arranged on a region of the metallic mirror layer, a semiconductor layer for generating a region being active during electrical operation, arranged on the first passivation layer, a second passivation layer comprising two regions, wherein the first region is arranged on the top face of the semiconductor layer, and the second region being free of the semiconductor layer is arranged on the metallic mirror layer, wherein the first region and the second region of the second passivation layer are separated from one another by a region which surrounds the first passivation layer and which is free of the second passivation layer.

By virtue of the fact that in the optoelectronic component the second passivation layer, which is arranged on the surface of the optoelectronic component, is subdivided into two partial regions that are separated from one another, no cracks or other mechanical defects can continue from one region into the other region. "Separated from one another" is primarily understood to mean that the two regions of the second passivation layer have no direct mechanical contact with one another via which a crack could propagate. In this case, the second region of the second passivation layer is arranged, inter alia, on the region in which severe mechanical loads can occur during the singulation process in the production method. The individual components can be singulated by sawing, for example, which can give rise to cracks in the second region of the second passivation layer or else in the underlying layers. From the underlying layers, the cracks can continue into the second region of the second passivation layer. By contrast, the first region of the second passivation layer is situated on the surface of the semiconductor layer. By virtue of the fact that the first and second regions of the second passivation layer have no mechanical contact with one another, cracks that have formed in the second region of the second passivation layer now cannot continue into the first region of the second passivation layer. Thus, the semiconductor layer and the first region of the second passivation layer are not damaged despite mechanical loading of adjoining regions. As a consequence, no moisture or other disturbing environmental influences can penetrate into the semiconductor layer through the first region of the second passivation layer. As a result, the lifetime of the component is significantly increased.

In a further example of the optoelectronic component, the first passivation layer and the second passivation layer are spatially separated from one another.

"Spatial separation" should primarily be understood to mean that there is no direct mechanical contact between the first passivation layer and the second passivation layer via which a crack could continue, for example. As a result, crack propagation starting from the second region of the second passivation layer is also not possible via the first passivation layer. Consequently, a crack that forms, for example, in the second region of the second passivation layer cannot continue via the first passivation layer toward the first region of the second passivation layer. The consequence of this is that not only the first region of the second passivation layer, but also the first passivation layer cannot be damaged by continuation of cracks or other mechanical damage occurring in the second region of the second passivation layer. Consequently, the semiconductor layer is also protected against damage from its bottom side.

In one example of the optoelectronic component, the semiconductor layer has overhanging edges with respect to the first passivation layer.

This means that the first passivation layer, in the region of the overhanging edges of the semiconductor layer, is arranged beneath the edges and the semiconductor layer projects beyond the first passivation layer. The edges therefore overshadow the first passivation layer. This makes it possible, for example, to prevent formation of a direct mechanical contact between the second passivation layer whose first region extends over the semiconductor layer and the first passivation layer. Furthermore, it prevents formation of a mechanical contact between the first passivation layer and the second region of the second passivation layer during the application of the second passivation layer. From the overhang of the semiconductor layer with respect to the first passivation layer, a further advantage arises for the production method. Thus, as a result of the design with the overhanging edges, the second passivation layer can be applied in large-area fashion over the component, wherein said passivation layer tears off by itself at the overhanging edges such that a first region and a second region of the second passivation layer form without the need for structured application. As a result of the second passivation layer tearing off, there is no longer any mechanical connection between the first region and the second region of the second passivation layer.

In a further example of the optoelectronic component, the first passivation layer is interrupted in a region of the overhanging edges so that a region is formed which is free of the first passivation layer.

In this example, instead of removal of the entire first passivation layer that was uncovered by the structuring of the semiconductor layer, only a part of the first passivation layer was removed, such that, in the first passivation layer arranged at least partly beneath the semiconductor layer, a surrounding region was formed which separates the region beneath the semiconductor layer from the rest of the first passivation layer. "Separation" should be understood to mean, in particular, that there is no mechanical connection between the different parts of the first passivation layer such that a crack that has formed in the region of the first passivation layer which is not in contact with the semiconductor layer, or alternatively has formed in the second region of the second passivation layer, cannot continue into the region of the first passivation layer which is in direct contact with the semiconductor layer.

In a further example, the optoelectronic component no longer has a first passivation layer in the regions in which no semiconductor layer is present. After the structuring or during the structuring of the semiconductor layer, the first passivation layer uncovered thereby was therefore completely removed.

In a further example of the optoelectronic component, the semiconductor layer has lateral mesa flanks.

Depending on which technique is employed for structuring the semiconductor layer, the mesa flanks have a greater or lesser inclination. The mesa flanks can be covered by the second passivation layer in the same way as the top face of the semiconductor layer. The second passivation layer arranged on the mesa flanks is therefore a part of the first region of the second passivation layer. The semiconductor layer is therefore surrounded on the top face and also at its side areas by the first region of the second passivation layer and is protected by the latter.

In one example of the optoelectronic component, the latter is designed as a thin-film LED chip.

A thin-film LED chip is distinguished by at least one of the following characteristic features:

- a reflective layer is applied or formed at a main area—facing toward a carrier element, in particular the carrier substrate—of the radiation-generating semiconductor layer sequence, which is, in particular, a radiation-generating epitaxial layer sequence, said reflective layer reflecting at least part of the electromagnetic radiation generated in the semiconductor layer sequence back into the latter;
- the thin-film LED chip has a carrier element, which is not the growth substrate on which the semiconductor layer sequence was grown epitaxially, but rather a separate carrier element subsequently fixed to the semiconductor layer sequence;
- the semiconductor layer sequence, has a thickness in the range of 20 μm or less, in particular in the range of 10 μm or less;
- the semiconductor layer sequence is free of a growth substrate. "Free of a growth substrate" means that any growth substrate possibly used for growth purposes is removed from the semiconductor layer sequence or is at least greatly thinned. In particular, it is thinned in such a way that it is not self-supporting by itself or together with the epitaxial layer sequence alone. The remaining residue of the greatly thinned growth substrate is, in particular, unsuitable as such for the function of a growth substrate; and
- the semiconductor layer sequence contains at least one semiconductor layer having at least one area having an intermixing structure which ideally leads to an approximately ergodic distribution of the light in the semiconductor layer sequence, that is to say that it has an as far as possible ergodically stochastic scattering behavior.

A basic principle of a thin-film LED chip is described for example in the document I. Schnitzer et al., Appl, Phys. Lett. 63 (16) Oct. 18, 1993, pages 2174-2176, the disclosure of which is hereby incorporated by reference. Examples of thin-film LED chips are described in the documents EP 0905797 A2 and WO 02/13281 A1, the disclosure of which is hereby likewise incorporated by reference.

Preferably, the finished component no longer has a substrate.

One method for producing an optoelectronic component comprises the following method steps: providing a layer arrangement comprising a carrier, a metallic mirror layer, a first passivation layer and a semiconductor layer as method step A), removing a part of the first passivation layer as method step B), applying a second passivation layer on the top face of the semiconductor layer and on the metallic mirror layer, wherein a first region of the second passivation layer is produced on the top face of the semiconductor layer and a second region of the second passivation layer is produced on the mirror layer, and a region is formed which surrounds the first passivation layer, and which is free of the second passivation layer separating the first region and the second region from one another, as method step C).

The first passivation layer is removed in method step B) to an extent such that a first region and a second region are formed during the subsequent application in method step C) of the second passivation layer. As a result of the partial removal of the first passivation layer in method step B), there is no mechanical connection between the first region and the second region of the second passivation layer such that a crack or some other mechanical damage that forms in one of the two regions cannot continue in the other region. As a result of the removal of a part of the first passivation layer, a region is formed around the part of the first passivation layer which is in direct contact with the semiconductor layer. The region is free of the first passivation layer. This free region spatially separates the first region of the second passivation layer from the second region. Propagation of, for example, cracks that form in the second region of the second passivation layer is therefore not possible across the free region.

In a further method, method step A) comprises the following method substeps: providing a substrate as method substep A1), growing a semiconductor layer, for producing a region being active during electrical operation on the substrate, as method substep A2), applying a first passivation layer to the semiconductor layer, as method substep A3), applying a metallic mirror layer to the first passivation layer as method substep A4), mounting a carrier onto the metallic mirror layer as method substep A5), removing the substrate from the semiconductor layer as method substep A6), and structuring the semiconductor layer as method substep A7).

A layer arrangement such as it is provided in method step A) can be produced by method substeps A1) to A7). Said layer arrangement comprises a carrier, a metallic mirror layer arranged on the carrier, a first passivation layer arranged on the metallic mirror layer, and a structured semiconductor layer arranged on the first passivation layer.

In a further method, a mesa is formed in the semiconductor layer as a result of the structuring in method substep A7), wherein the semiconductor layer has lateral mesa flanks after the structuring.

The structuring of the semiconductor layer in method substep A7) can be effected by an etching step, for example. Mesa trenches are etched into the semiconductor layer such that the semiconductor layer now has lateral mesa flanks. Depending on the technique used for structuring the semiconductor layer, the mesa flanks have a greater or lesser inclination. In this method variant, in method step C) the second passivation layer is also applied to the mesa flanks. The second passivation layer on the surface of the semiconductor layer and also the second passivation layer on the mesa flanks of the semiconductor layer together form the first region of the second passivation layer.

In a further method, applying the second passivation layer in method step C) is effected such that the first passivation layer and the second passivation layer are spatially separated from one another.

In this method, at least the entire part of the first passivation layer which is not in direct contact with the semiconductor layer is removed in method step B). By virtue of the fact that there is no mechanical connection between the first and the second passivation layer, damage such as a crack, for example, which arises in the second region of the first passivation layer cannot continue into the first passivation layer.

In a further method, the first passivation layer is removed in method step B) such that overhanging edges are produced in the semiconductor layer with respect to the first passivation layer.

In this method, a part of the first passivation layer which is arranged beneath the already structured semiconductor layer, is also removed. This can be effected by an etching process, for example. In this case, the semiconductor layer would thus be partly undercut.

By virtue of the overhanging edges of the semiconductor layer, the second passivation layer can be applied in large-area fashion over the entire component in method step C), wherein the second passivation layer tears off at the overhanging edge, and the spatially separated regions of the second passivation layer are thus formed. A first region is formed, which is arranged on the surface of the semiconductor layer and on the mesa flanks of the semiconductor layer, and a second region is formed, which is arranged on the metallic mirror layer that is free of the first semiconductor layer. The overhanging edges furthermore make it possible to apply the second passivation layer in large-area fashion without arising spatial contact with the first passivation layer. Use of masks or stencils is not necessary in this case.

In one method, a wet chemical method is used in method step B).

By way of example, an acid or alkaline solution can be used in the wet chemical method. The wet chemical method enables also removing parts of the first passivation layer which are not exposed or which are not directly accessible and are situated beneath the already structured semiconductor layer. In the wet chemical method, it is also possible to remove parts of the first passivation layer which, by way of example, could not be reached by an ion beam.

In a further method, the wet chemical method is used for removing a part of the first passivation layer which is arranged beneath the structured semiconductor layer.

The semiconductor layer is therefore undercut. The use of a wet chemical method enables the semiconductor layer to be undercut significantly further than with a physical method. In the case of a physical etching method, the semiconductor layer could not be undercut at all, or could be undercut only very slightly. The extent to which the semiconductor layer is undercut can be controlled for example by way of the time of action of the etching solution used. A further factor that can be used to control the extent of undercutting is the concentration of the etching solution used. Large-area application of the etching solution results in the undercutting of the semiconductor layer and also in removal of those regions of the first passivation layer which are not in direct contact with the semiconductor layer after the structuring of the semiconductor layer. Through targeted local application of the etching solution, however, it is also possible to remove only a region of the first passivation layer which surrounds that part of the first passivation layer which is in direct contact with the semiconductor layer. In this case, this surrounding region extends at least partly under the semiconductor layer. For the case where the first passivation layer comprises $SiO_2$, buffered hydrofluoric acid is suitable, for example, as an etching solution. The etching solution is preferably chosen such that neither the metallic mirror layer nor the semiconductor layer is attacked by it.

In a further method, the entire first passivation layer that is uncovered after the structuring of the semiconductor layer is removed in method step B).

This can be done with a wet chemical method, for example, in which the etching solution is applied in large-area fashion.

In a further method, applying the second passivation layer in method step C) is effected in large-area fashion, wherein the large-area film tears off at the overhanging edges, whereupon the first region and the second region of the second passivation layer are formed.

The material of the second passivation layer is therefore not applied locally. Neither masks nor stencils are used during application.

In one method, in method substep A3) a material is used for the first passivation layer which is selected from: $SiO_2$, SiN, $Al_2O_3$.

In this case, $SiO_2$ is preferred. $SiO_2$ is particularly well suited for the passivation of optoelectronic components inter alia on account of its good stability with respect to radiation.

Figure 1:
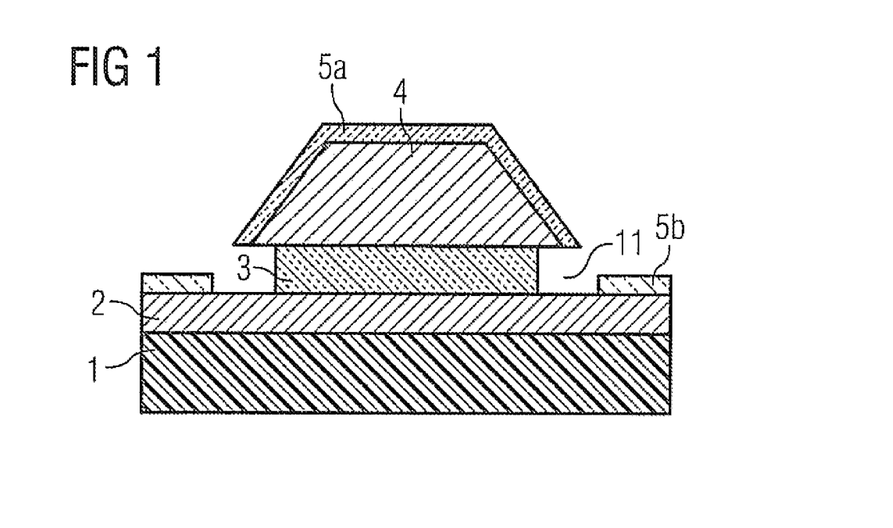
FIG. 1 shows a schematic side view of one example of an optoelectronic component.

Turning now to the drawings, FIG. 1 shows a schematic side view of one example of the optoelectronic component. This example comprises a carrier 1. A metallic mirror layer 2 is arranged on the carrier 1. A structured first passivation layer 3 is arranged in the central region of the metallic mirror layer 2. A structured semiconductor layer 4 having mesa flanks is arranged on the first passivation layer 3. The semiconductor layer 4 has overhanging edges with respect to the first passivation layer 3 situated underneath. The first region 5a of the second passivation layer is arranged on the top face of the semiconductor layer 4 and on the mesa flanks of the semiconductor layer. A region 11 being free of the second passivation layer 5 surrounds the first passivation layer 3. The surrounding region 11 extends partly under the semiconductor layer 4 and surrounds the latter. The surrounding region 11 is followed by the second region 5b of the second passivation layer at the edges on the metallic mirror layer 2. As can be discerned in FIG. 1, there is no mechanical contact between the first region 5a and the second region 5b of the second passivation layer. Furthermore, it can be seen in FIG. 1 that neither the first region 5a nor the second region 5b of the second passivation layer is in mechanical contact with the first passivation layer 3. A mechanical defect such as a crack, for example, can arise in the second region 5b of the second passivation layer for example during the singulation of a plurality of components arranged on a common carrier by the severing of the second region 5b of the second passivation layer and the underlying mirror layer and the carrier. On account of the lack of mechanical contact, the crack cannot continue either into the first passivation layer 3 or into the first region 5a of the second passivation layer. Consequently, the first region 5a of the second passivation layer would remain intact even in the event of the second region 5b of the second passivation layer being damaged.

Figure 2:
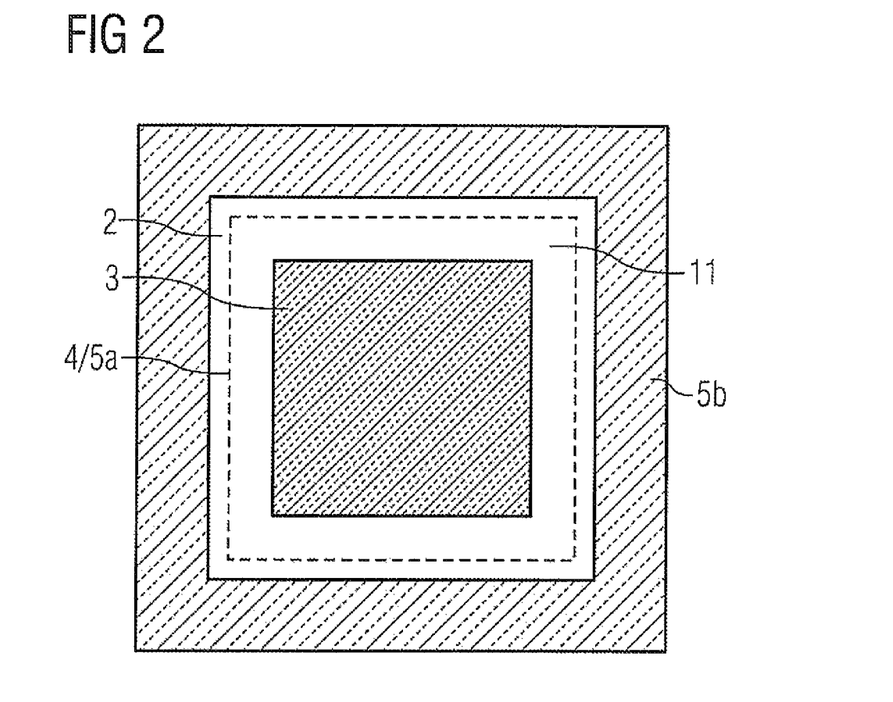
FIG. 2 shows a schematic plan view of one example of an optoelectronic component.

FIG. 2 shows the schematic plan view of the example of an optoelectronic component shown in cross section in FIG. 1. FIG. 2 reveals the metallic mirror layer 2 in the region of the surrounding region 11, the mirror layer being situated on a side of the second region 5b of the second passivation layer. The first passivation layer 3 is arranged on the metallic mirror layer 2 below the structured semiconductor layer 4, which is not shown here for reasons of clarity. The dashed line around the first passivation layer 3 indicates the position of the overhanging edges of the semiconductor layer 4, which is otherwise not shown here and which is situated on the first passivation layer 3 and has overhanging edges with respect to the first passivation layer 3. The first region 5a of the second passivation layer is additionally arranged on the semiconductor layer 4. It can be seen in FIG. 2 that there is no mechanical contact between the first region 5a of the second passivation layer, said region being bounded by the dashed line, and the second region 5b—extending on the outer side—of the second passivation layer. The two regions 5a/5b of the second passivation layer are present in a manner spatially separated from one another.

Figure 3:
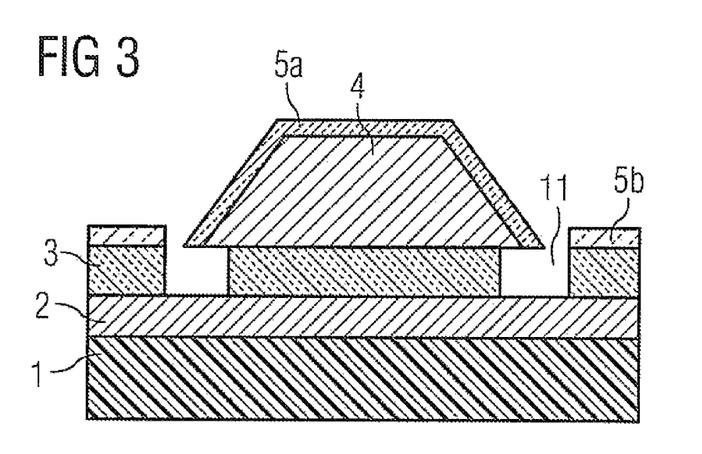
FIG. 3 shows a schematic side view of a further example of an optoelectronic component.

FIG. 3 shows a schematic side view of a further example of the optoelectronic component. The construction largely corresponds to the example as illustrated in FIG. 1. However, this example additionally has the first passivation layer 3 between the second region 5b of the second passivation layer and the metallic mirror layer 2. Consequently, in this example, the surrounding region 11 is bounded toward both sides by the first passivation layer 3. In this example, the surrounding region 11 is therefore shaped like a circumferential trench in the first passivation layer 3. Such an example can be obtained, for example, by local removal of the first passivation layer 3.

Figure 4:
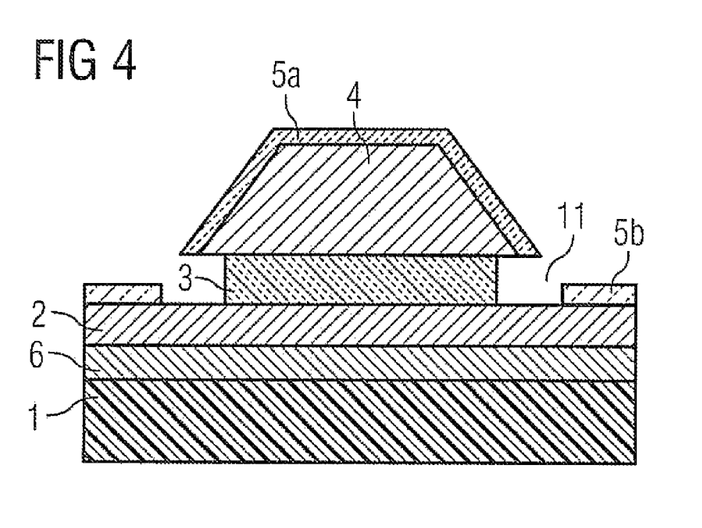
FIG. 4 shows a schematic side view of a further example of an optoelectronic component, which additionally comprises a barrier layer.

FIG. 4 shows a schematic side view of a further example of the optoelectronic component. This example largely corresponds to the example as illustrated in FIG. 1. However, it additionally contains a barrier layer 6 between the carrier 1 and the metallic mirror layer 2. The barrier layer 6 can, for example, prevent the migration of ions from the metallic mirror layer 2 into the carrier 1. By way of example, TiWN is suitable for the barrier layer 6.

Figure 5:
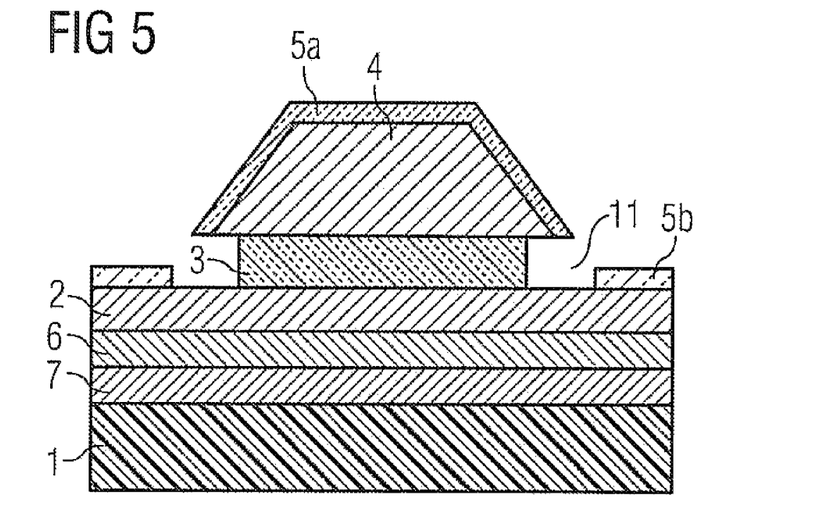
FIG. 5 shows a schematic side view of a further example of an optoelectronic component, which additionally also comprises an adhesion layer.

FIG. 5 shows a schematic side view of a further example of the optoelectronic component. This example largely corresponds to the example as illustrated in FIG. 4. However, the example illustrated in FIG. 5 additionally contains an adhesion layer 7 arranged between the carrier 1 and the barrier layer 6. The adhesion layer 7 serves for better adhesion of the carrier 1 to the barrier layer 6.

Figure 6:
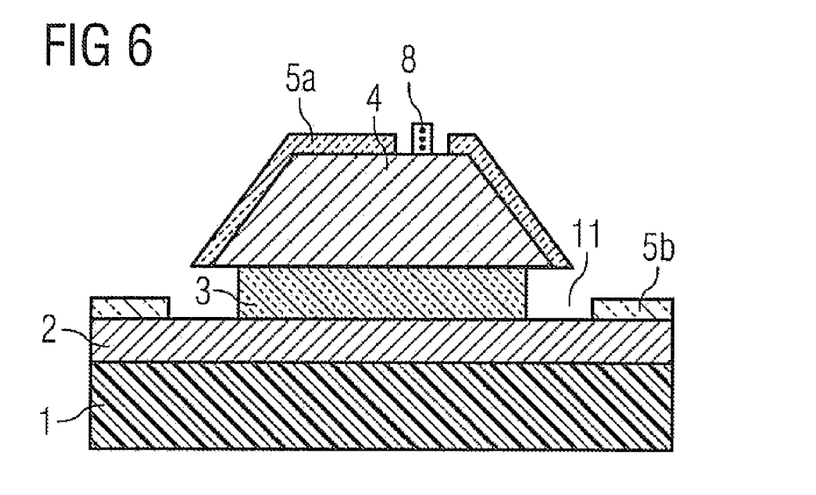
FIG. 6 shows a schematic side view of a further example of an optoelectronic component, which additionally also comprises a contact.

FIG. 6 shows a schematic side view of a further example of the optoelectronic component. This example largely corresponds to the example as illustrated in FIG. 1. However, the example illustrated in FIG. 6 additionally comprises an electrical contact 8 situated on the top face of the semiconductor layer 4. Electrical contact can be made with the component via the electrical contact 8, for example, with a bonding wire. Further electrical contact can be made via the carrier 1, for example.

FIGS. 7a to 7h in each case show in a schematic side view different method stages of a production method for one example of the optoelectronic component.

Figure 7A:
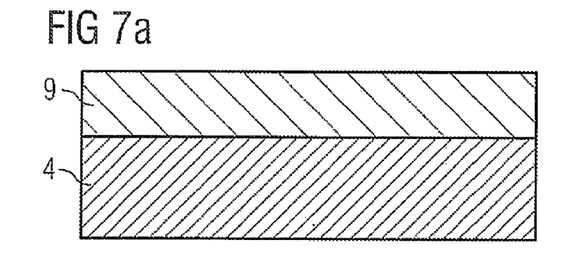
FIGS. 7a to 7h in each case show schematic side views of different method steps of a method for producing one example of the optoelectronic component.

FIG. 7a shows a substrate 9 on which a semiconductor layer 4 is arranged. The semiconductor layer 4 can be obtained by growth on the substrate, for example, as it is described in method substep A2). By way of example, GaN is suitable for the semiconductor layer 4.

Figure 7B:
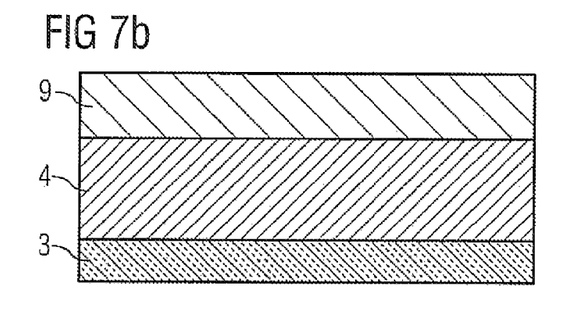

FIG. 7b shows a layer sequence which, in comparison with the layer sequence illustrated in FIG. 7a, additionally comprises the first passivation layer 3, which is arranged on the semiconductor layer 4. By way of example, $SiO_2$, SiN or $Al_2O_3$ can be used for the first passivation layer, $SiO_2$ being preferred. The application of the first passivation layer 3 in accordance with method substep A3) can be effected for example by PECVD (plasma enhanced chemical vapor deposition) onto the semiconductor layer 4. The layer thickness of the first passivation layer 3 can be 450 nm, for example.

Figure 7C:
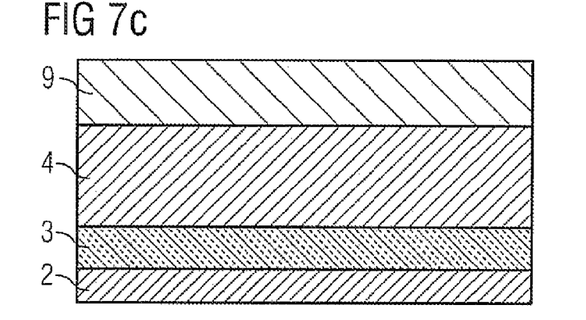

FIG. 7c shows in cross section a layer arrangement after method substep A4), the application of a metallic mirror layer 2. The metallic mirror layer 2 is arranged on the first passivation layer 3. By way of example, Al is suitable for the metallic mirror layer 2. The metallic mirror layer 2 can be applied to the first passivation layer 3 by vapor deposition, for example.

Figure 7D:
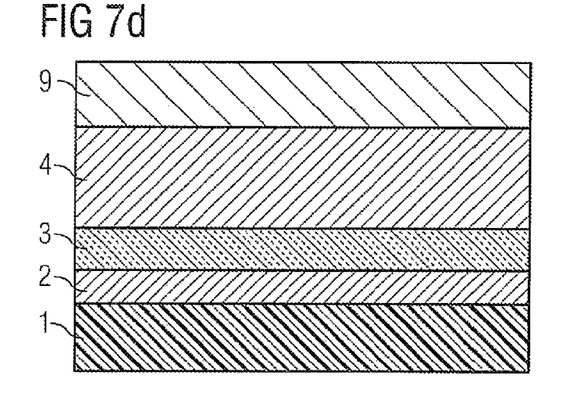

FIG. 7d shows a layer sequence which, in comparison with the layer sequence as illustrated in FIG. 7c, additionally comprises a carrier 1. The carrier 1 can comprise Ge, for example.

The placement of the carrier 1 in method substep A5) can for example be effected by a soldering method. The carrier 1 can also be connected to the metallic mirror layer 2 by an adhesion layer 7. The carrier 1 serves for stabilizing the layer sequence. The carrier 1 can furthermore be used for making electrical contact with the finished component.

Figure 7E:
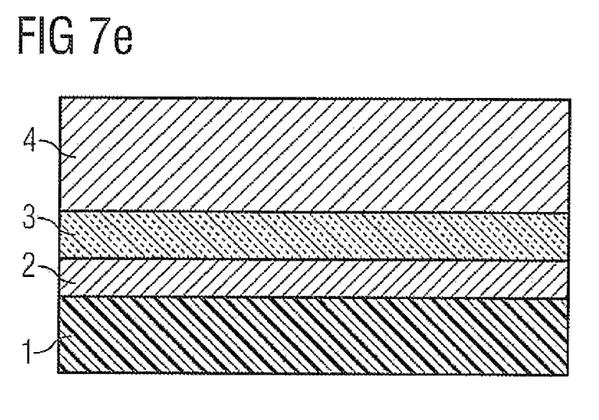

FIG. 7e shows a layer sequence such as could arise for example, from the layer sequence as illustrated in FIG. 7d. For this purpose, the substrate 9 was removed from the semiconductor layer 4. The removal according to method substep A6) can be effected by laser lift-off, for example.

Figure 7F:
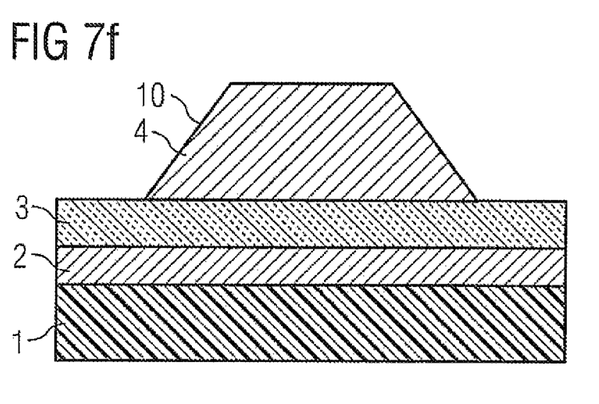

FIG. 7f shows a layer sequence such as could arise for example, from the layer sequence as illustrated in FIG. 7e. For this purpose, in a further method step, in accordance with method substep A7), the semiconductor layer 4 was structured. The semiconductor layer 4 then has lateral mesa flanks 10. The structuring of the semiconductor layer 4 can be effected by an etching step, for example. By way of example, a dry chemical etching such as RIE (reactive ion etching) can be used for the etching step.

Figure 7G:
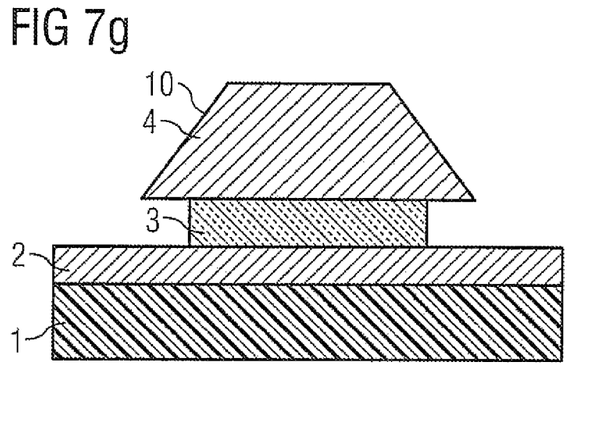

FIG. 7g shows a layer sequence such as could arise for example, from the layer sequence as illustrated in FIG. 7f. For this purpose, a part of the first passivation layer 3 was removed in method step B). The entire part of the first passivation layer 3 which was not in direct contact with the semiconductor layer 4 was removed in this case. Furthermore, a part of the first passivation layer 3 which was previously in direct contact with the semiconductor layer 4 was additionally removed, such that the semiconductor layer 4 now has overhanging edges with respect to the first passivation layer 3. The overhang can be 1 μm, for example. The partial removal of the first passivation layer 3 can be effected by an etching method, for example. For the case where the first passivation layer 3 comprises $SiO_2$, a buffered hydrofluoric acid is suitable as an etching solution. The metallic mirror layer 2 is not attached during the etching process. After the time of action has elapsed, the etching solution can simply be removed again by rinsing with deionized water, for example.

Figure 7H:
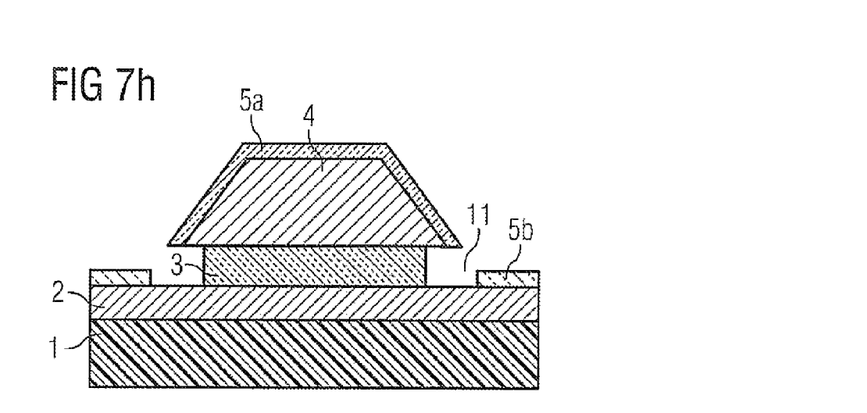

FIG. 7h shows the layer sequence of an optoelectronic component which corresponds to the layer sequence of the optoelectronic component as illustrated in FIG. 1. The component illustrated in FIG. 7h could arise, for example, from the component illustrated in FIG. 7g. For this purpose, in method step C), a second passivation layer 5 would have been applied over the surface of the optoelectronic component. By virtue of the overhanging edges of the semiconductor layer 4 with respect to the first passivation layer 3, the second passivation layer 5 would in this case tear off at the overhanging edges of the semiconductor layer 4, two regions thereby being formed. A first region 5a of the second passivation layer, the first region being arranged on the surface of the semiconductor layer 4 and on the mesa flanks of the semiconductor layer, and also a second region 5b of the second passivation layer, the second region being arranged on the metallic mirror layer 2. In this case, the application of the second passivation layer 5 can be effected by PECVD (plasma enhanced chemical vapor deposition), for example. By way of example, $SiO_2$, SiN or $Al_2O_3$ is suitable for the second passivation layer. $SiO_2$ is the preferred material both for the first passivation layer and for the second passivation layer.

Figure 8:
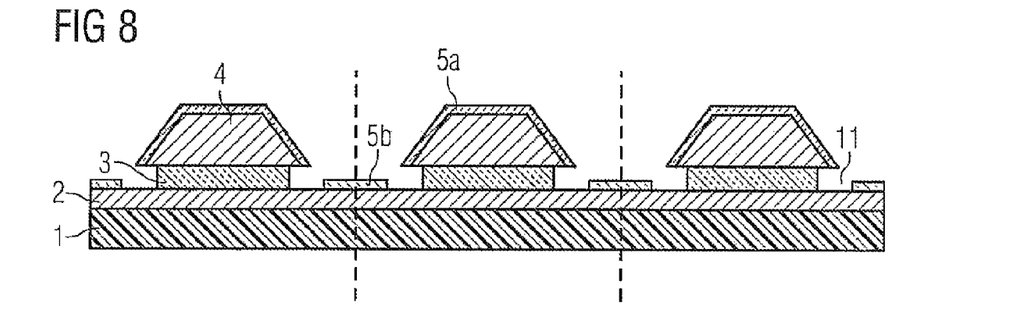
FIG. 8 shows a schematic side view of three components that have not been singulated yet.

FIG. 8 shows in a schematic side view three components that have not yet been singulated. These components, after singulation, correspond to the component illustrated in FIG. 7h. For reasons of clarity, only three interconnected components have been illustrated by way of example. The number of components present in interconnected fashion before singulation can be significantly more than three. The two dashed lines in FIG. 8 indicate where the singulation of the components takes place.

The first passivation layer 3 can also be structured in further examples of the production method, such that the metallic mirror layer 2 and the semiconductor layer 4 are in direct electrically conductive contact with one another.

This disclosure is not limited by the description on the basis of the examples. Rather, the disclosure encompasses any novel feature and also any combination of features, which in particular includes any combination of features in the appended patent claims, even if the feature or combination itself is not explicitly specified in the claims or examples.

The invention claimed is:

1. An optoelectronic component comprising:
a carrier;
a metallic mirror layer arranged on the carrier;
a first passivation layer arranged on a region of the metallic mirror layer;
a semiconductor layer that generates an active region being active during electrical operation arranged on the first passivation layer;
a second passivation layer comprising two regions, wherein the first region is arranged on the top face of the semiconductor layer, and the second region being free of the semiconductor layer is arranged on the metallic mirror layer; and
wherein the first and second regions are separated from one another by a region which surrounds the first passivation layer and which is free of the second passivation layer, the semiconductor layer has lateral mesa flanks and overhanging edges with respect to the first passivation layer, the first passivation layer is arranged beneath the edges, and the semiconductor layer projects beyond the first passivation layer.

2. The optoelectronic component according to claim 1, wherein the first passivation layer and the second passivation layer are arranged spatially separated from one another.

3. The optoelectronic component according to claim 1, wherein the first passivation layer is interrupted in a region of the overhanging edges, such that a region is formed which is free of the first passivation layer.

4. A thin-film LED chip comprising the optoelectronic component according to claim 1.

5. The optoelectronic component according to claim 1, wherein a first region of the second passivation layer is arranged on the top face and also at all its side areas of the semiconductor layer.

6. The optoelectronic component according to claim 1, wherein the metallic mirror layer is planar so that a second region of the second passivation layer and the first passivation layer, which are arranged on the metallic mirror layer, lie in one plane.

7. The optoelectronic component according to claim 1, wherein a second region of the second passivation layer is ring-shaped and surrounds the first passivation layer.

8. The optoelectronic component according to claim 1, wherein a first and second region of the second passivation layer and the first passivation layer are arranged spatially separated from one another.

9. The optoelectronic component according to claim 1, wherein the first and second passivation layer comprise the same material.

10. The optoelectronic component according to claim 1, wherein the material of the first and/or second passivation layer is selected from the group of $SiO_2$, SiN and $Al_2O_3$.

11. The optoelectronic component according to claim 1, wherein the first passivation layer has a larger thickness in side view of the optoelectronic component compared to the second passivation layer.

12. An optoelectronic component comprising:
   a carrier;
   a metallic mirror layer arranged on the carrier;
   a first passivation layer arranged on a region of the metallic mirror layer;
   a semiconductor layer that generates an active region during electrical operation arranged on the first passivation layer;
   a second passivation layer comprising two regions;
   wherein
   1) the semiconductor layer comprises a top face arranged in side view on an opposite side of the metallic mirror layer;
   2) the semiconductor layer further comprises mesa flanks as side areas which have an inclination;
   3) the semiconductor layer further comprises edges;
   4) the first passivation layer is arranged between the metallic mirror layer and the semiconductor layer;
   5) the first passivation layer is arranged beneath the edges of the semiconductor layer;
   6) the edges of the semiconductor layer overshadow the first passivation layer;
   7) a first region of the second passivation layer is arranged on the top face and on the mesa flanks of the semiconductor layer so that the semiconductor layer is surrounded on the top face and also at its side areas by the first region of the second passivation layer; and
   8) a second region of the second passivation layer is planar and arranged on the metallic mirror layer.

* * * * *